(12) United States Patent
Stanley et al.

(10) Patent No.: US 9,560,749 B2
(45) Date of Patent: Jan. 31, 2017

(54) ELECTRONIC DEVICES HAVING STRESS CONCENTRATORS FOR PRINTED CIRCUIT BOARDS

(71) Applicant: Apple Inc., Cupertino, CA (US)

(72) Inventors: Craig M. Stanley, Campbell, CA (US); Phillip Qian, San Jose, CA (US); Erik L. Wang, Redwood City, CA (US)

(73) Assignee: APPLE INC., Cupertino, CA (US)

( * ) Notice: Subject to any disclaimer, the term of this patent is extended or adjusted under 35 U.S.C. 154(b) by 95 days.

(21) Appl. No.: 14/216,916

(22) Filed: Mar. 17, 2014

(65) Prior Publication Data

US 2015/0264798 A1 Sep. 17, 2015

(51) Int. Cl.
| | |
|---|---|
| *H05K 1/16* | (2006.01) |
| *H05K 1/02* | (2006.01) |
| *H05K 3/28* | (2006.01) |
| *H05K 1/11* | (2006.01) |
| *H05K 1/14* | (2006.01) |
| *H05K 3/46* | (2006.01) |

(52) U.S. Cl.
CPC .............. *H05K 1/028* (2013.01); *H05K 3/284* (2013.01); *H05K 1/0278* (2013.01); *H05K 1/11* (2013.01); *H05K 1/118* (2013.01); *H05K 1/14* (2013.01); *H05K 1/147* (2013.01); *H05K 1/148* (2013.01); *H05K 3/4691* (2013.01); *H05K 2201/10053* (2013.01); *H05K 2203/1316* (2013.01)

(58) Field of Classification Search
CPC .......... H05K 1/148; H05K 1/147; H05K 1/14; H05K 1/11; H05K 1/118

USPC 361/765, 784, 789, 792, 793, 795; 174/250, 251, 254
See application file for complete search history.

(56) References Cited

U.S. PATENT DOCUMENTS

| | | | |
|---|---|---|---|
| 5,406,027 A * | 4/1995 | Matsumoto ........... | H01L 25/162 174/260 |
| 8,130,356 B2 | 3/2012 | Lee et al. | |
| 8,143,531 B2 | 3/2012 | Miki et al. | |
| 8,525,341 B2 | 9/2013 | Kim et al. | |
| 8,541,685 B2 * | 9/2013 | Sugiyama .............. | H01R 12/62 174/254 |
| 2002/0029900 A1 | 3/2002 | Wimberger Friedl et al. | |
| 2006/0213682 A1 | 9/2006 | Moon et al. | |
| 2007/0281499 A1 * | 12/2007 | Muro ................... | H05K 1/0278 439/26 |
| 2010/0097775 A1 | 4/2010 | Kashiwazaki et al. | |

(Continued)

*Primary Examiner* — Binh Tran
(74) *Attorney, Agent, or Firm* — Brownstein Hyatt Farber Schreck, LLP

(57) ABSTRACT

An electronic device may have circuitry mounted on a printed circuit board. The circuitry may include electronic components such as integrated circuits, sensors, and switches that are sensitive to bending-induced stress in the printed circuit board. An overmolded plastic stress concentrator may be overmolded over the printed circuit board and the circuitry on the printed circuit board. A flexible plastic body may be used to enclose the stress concentrator and printed circuit board. The plastic body, stress concentrator, and printed circuit board may be elongated along a longitudinal axis. The stress concentrator may have unbent regions in which the printed circuit board is prevented from flexing and enhanced flexibility regions. Sensitive circuitry may be located in the unbent regions to prevent the sensitive circuitry from being exposed to bending stress.

22 Claims, 16 Drawing Sheets

(56) References Cited

U.S. PATENT DOCUMENTS

| | | | |
|---|---|---|---|
| 2012/0253485 A1* | 10/2012 | Weast | G06F 1/163 700/91 |
| 2013/0188322 A1 | 7/2013 | Lowe | |
| 2014/0016286 A1* | 1/2014 | Tatsu | G06K 19/07345 361/752 |
| 2014/0062920 A1 | 3/2014 | Lee et al. | |
| 2014/0354900 A1* | 12/2014 | Qian | G06F 1/1658 349/12 |

* cited by examiner

ELECTRONIC DEVICES HAVING STRESS CONCENTRATORS FOR PRINTED CIRCUIT BOARDS

BACKGROUND

This relates generally to electronic devices, and, more particularly, to structures for preventing damage to electronic device circuitry.

Electronic devices include components such as buttons, integrated circuits, and other electrical components. These components are mounted to printed circuit boards. Devices may be exposed to external forces during use. For example, a user of a device may intentionally or unintentionally apply force to a device housing. The applied force can stress internal components. For example, the force applied to a device may bend printed circuit boards within the device.

If care is not taken, devices that are subjected to external forces can become damaged. If a printed circuit or other substrate is bent excessively, stress may develop in the printed circuit that causes sensitive circuitry on the printed circuit to become damaged. For example, sensitive integrated circuits and other electronic components may become damaged, solder joints that are used in mounting electrical components to the printed circuit may fail, and other sensitive structures may be adversely affected by excess stress arising from a bent substrate.

It would therefore be desirable to be able to provide structures for protecting electronic devices from damage due to printed circuit stress.

SUMMARY

An electronic device may have circuitry mounted on a printed circuit board. The circuitry may include electronic components such as integrated circuits, sensors, and switches that are sensitive to bending-induced stress in the printed circuit board. A plastic stress concentrator may be molded over the printed circuit board and the circuitry on the printed circuit board. A flexible plastic body may be used to enclose the stress concentrator and printed circuit board. The plastic body, stress concentrator, and printed circuit board may be elongated along a longitudinal axis.

The stress concentrator may have unbent regions in which the printed circuit board is prevented from flexing and may have enhanced flexibility regions that are more flexible than the unbent regions. The enhanced flexibility regions allow the printed circuit board to bend to accommodate application of external forces to the electronic device. Sensitive circuitry may be located in the unbent regions. The unbent regions are stiffer than the regions of enhanced flexibility and resist bending. This prevents the sensitive circuitry from being exposed to bending stress.

DETAILED DESCRIPTION

Electronic devices may be provided with electrical components that are mounted on substrates such as printed circuits. For example, electrical components may be mounted on a printed circuit using solder or conductive adhesive. To prevent damage to the printed circuit during application of external stress to a device, a stress concentrator can be formed on the printed circuit. When external stress is applied to the device, the printed circuit will tend to bend. The stress concentrator ensures that any bending of the printed circuit will take place only at locations along the printed circuit that are free of sensitive circuitry.

Figure 1:
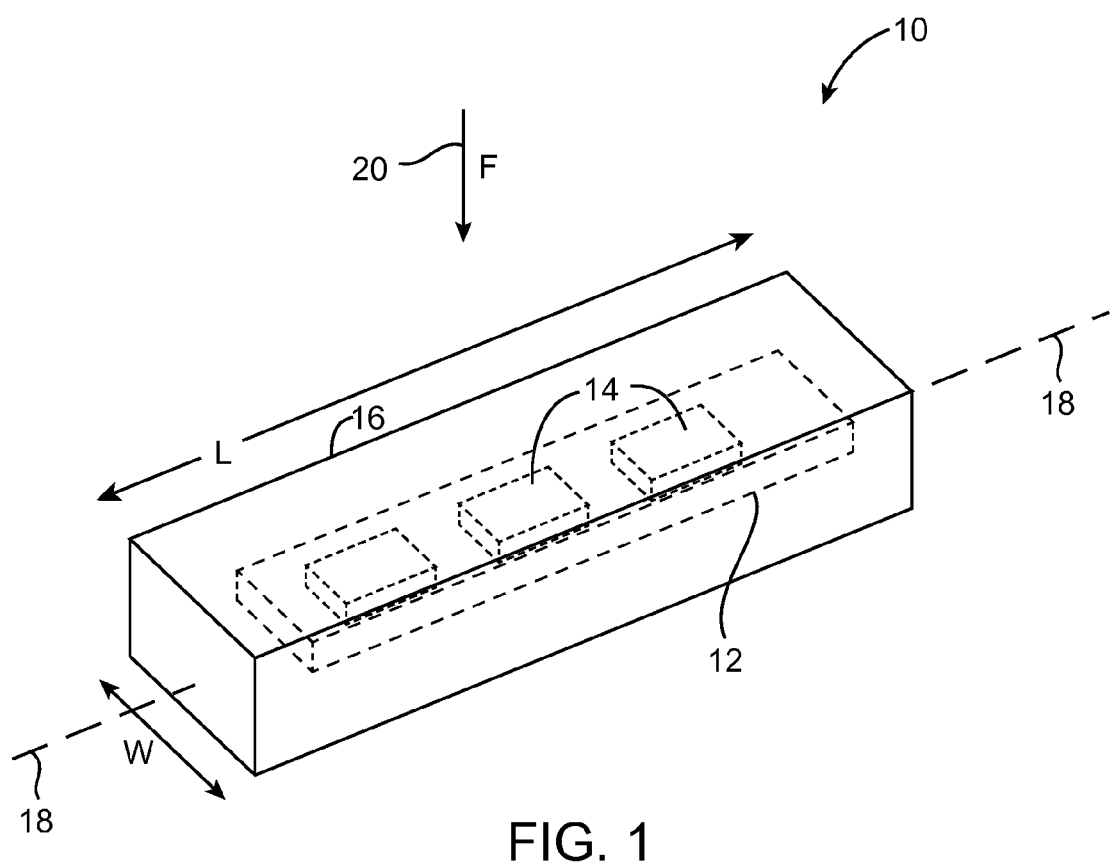
FIG. 1 is a perspective view of an illustrative electronic device that may be provided with a stress concentrator for preventing damage to circuitry on a printed circuit due to externally applied force in accordance with an embodiment.

A perspective view of an illustrative electronic device that may be provided with one or more printed circuits is shown in FIG. 1. An electronic device such as electronic device 10 of FIG. 1 may be an accessory such as a controller for a headset, a laser pointer, an electronic stylus for use with a tablet computer or electronic drawing surface, all or part of a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, accessories used with this equipment, or other electronic equipment.

In the illustrative configuration of FIG. 1, device 10 has a body 16 that is elongated along longitudinal axis 18. In particular, device 10 has a length L along longitudinal axis 18 that is larger than lateral dimensions such as width W (i.e., longitudinal dimension L is significantly larger than transverse dimensions such as width W). Elongated devices such as device 10 of FIG. 1 tend to be more susceptible to bending during the application of external force than other devices, due to the lever arm produced by length L. As an example, if a user were to apply force F to device 10 in downward direction 20, the middle of device 10 would tend to bend downward relative to the ends of device 10. This type of external force may be applied to device 10 intentionally (e.g., when a user is pressing on device 10 with the user's fingers to actuate a button) or may be applied to device 10 unintentionally (e.g., when device 10 is located in the clothing of a user and the user sits on device 10 or leans on device 10).

Device 10 and the components and substrates of device 10 may have any suitable shapes. Configurations of the type shown in FIG. 1 in which device 10 has an elongated shape are sometimes described herein as an example. In elongated device arrangements, device 10 may have a housing that is box-shaped (e.g., a shape with six planar sides), cigar-shaped, an ellipsoid, a shape with one or more flat sides and one or more smoothly curved surfaces, a shape with a triangular cross-section and rounded ends, or other suitable shape.

Device 10 may contain electronic components 14 mounted on one or more substrates such as substrate 12. Components 14 may include buttons, switches, integrated circuits, discrete components such as resistors, inductors, and capacitors (e.g., surface mount technology components), electrical connectors, optical sensors, pressure sensors, accelerometers, capacitive sensors, touch sensors, speakers, microphones, microelectromechanical systems (MEMS) devices, wires with solder joints, and other circuitry. Substrate 12 may be a printed circuit such as a rigid printed circuit board (e.g., a printed circuit board formed from a rigid printed circuit board material such as fiberglass-filled epoxy), a flexible printed circuit (e.g., a printed circuit formed from patterned metal traces on a flexible substrate such as a layer of polyimide or a sheet of other flexible polymer), a "rigid flex" substrate (i.e., a rigid printed circuit board with flexible printed circuit tails), a ceramic layer, a glass layer, a molded plastic carrier, or other dielectric substrate. Printed circuits may contain one or more laminated layers of dielectric and/or vias and one or more layers of patterned metal traces that form signal lines. Configurations for device 10 in which substrate 12 is a printed circuit such as a rigid printed circuit board are sometimes described herein as an example. This is, however, merely illustrative. Substrate 12 may be formed from any suitable dielectric structures for supporting circuitry 14.

Body 16 of device 10 may sometimes be referred to as a case or housing. Body 16 may be formed of materials such as plastic (e.g., flexible plastic that allows a user to press switches located on a printed circuit board under body 16), glass, ceramics, carbon-fiber composites and other fiber-based composites, metal (e.g., machined aluminum, stainless steel, or other metals), other materials, or a combination of these materials. Device 10 may be formed using a unibody construction in which most or all of body 16 is formed from a single structural element (e.g., a piece of machined metal or a piece of molded plastic) or may be formed from multiple housing structures (e.g., outer housing structures that have been mounted to internal frame elements or other internal housing structures).

One or more substrates such as substrate 12 may be mounted within body (housing 16). As shown in the illustrative arrangement of FIG. 1, device 10, body 16, and at least one printed circuit 12 in device 10 may have an elongated shape with a longitudinal axis that is aligned with longitudinal axis 18 of device 10. Printed circuit 12 may, for example, have a length that extends along axis 18 and lateral (transverse) dimensions (like width W of device 10) that are perpendicular to longitudinal axis 18. Mounting arrangements like this may allow printed circuit 12 and components 14 to be mounted efficiently, but may expose printed circuit 12 to potential bending upon application of external forces to device 10.

Figure 2:
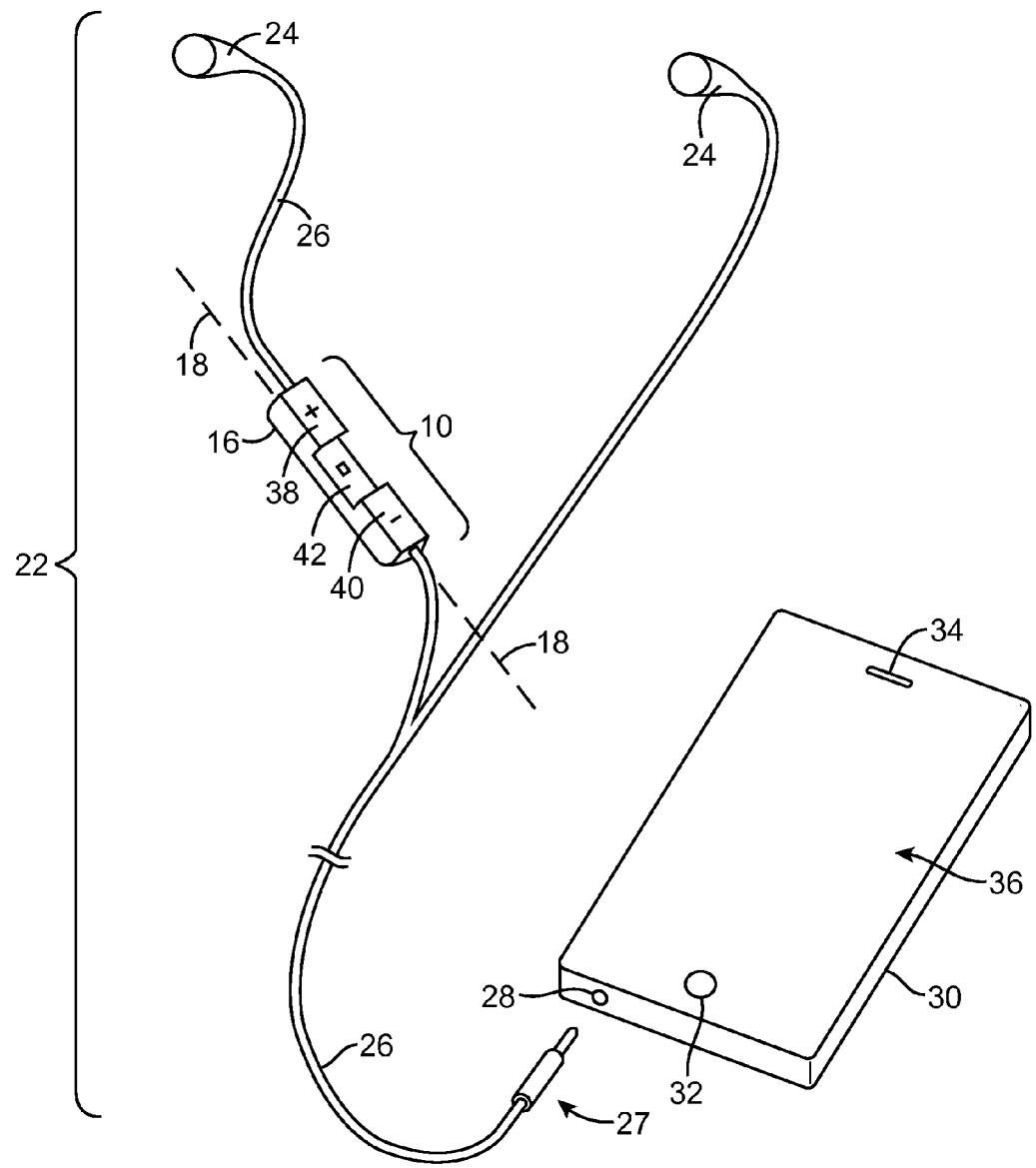
FIG. 2 is a perspective view of a system environment in which electronic equipment such as a headset with a headset controller is used with a portable electronic device in accordance with an embodiment.

FIG. 2 is a diagram of an illustrative system of the type that may include an electronic device (component) such as device 10 of FIG. 1. In the example of FIG. 2, device 10 is a controller for headset 22. Headset 22 plugs into electrical equipment 30 (e.g., a computer, cellular telephone, etc.), so that music and other audio content on equipment 30 can be played for a user. As shown in FIG. 2, headset 22 includes speakers 24 such as ear-bud speakers for presenting sound to a user's ears. Cables 26 include one or more wires for routing electrical signals between speakers 24, controller 10, and audio plug 27. Audio plug 27 plugs into mating audio jack 28 on electronic device 30. Electrical device 30 may be a computer, a television, a tablet computer, a music player, or other electrical equipment. In the illustrative example of FIG. 2, device 30 has touch screen display 36, menu button 32, and speaker port 34. Other types of electrical equipment may be provided with audio jacks such as audio jack 28 to mate with audio plug 27 of headset 22, if desired. The configuration of FIG. 2 is merely illustrative.

Controller 10 of FIG. 2 has buttons such as buttons 38, 40, and 42 formed at different locations along the length of device body 16 (i.e., at different positions along longitudinal axis 18 of device 10). A user may press on buttons 38, 40, and 42 to control device 30 and therefore the audio content being presented to the user through speakers 24. There may be three buttons in device 10, may be fewer than three buttons in device 10, or may be more than three buttons in device 10. The housing of device 10 may be formed from an elastomeric material that can be depressed by a user's fingers to actuate underlying switches mounted to printed circuit board 12 or may be formed from other suitable materials.

Figure 3:
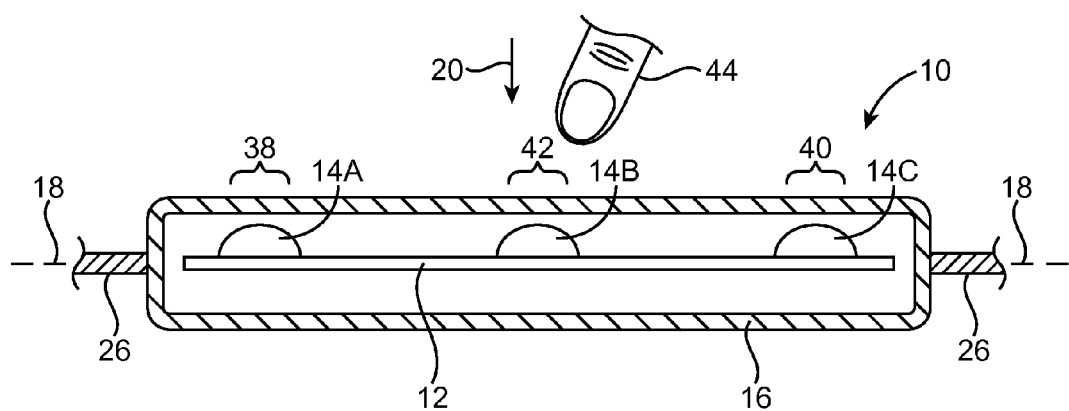
FIG. 3 is a cross-sectional side view of the headset controller of FIG. 2 in accordance with an embodiment.

A cross-sectional side view of headset controller 10 of FIG. 2 is shown in FIG. 3. As shown in FIG. 3, dome switches such as dome switches 14A, 14B, and 14C may be soldered or otherwise mounted on printed circuit 12 at different locations along longitudinal device axis 18 to form buttons 38, 42, and 40, respectively. Body 16 of device 10 may be formed from an elastomeric housing material that allows body 16 to flex when pressed downwards in direction 20 by user's finger 44. Wires 26 may be coupled to the opposing ends of device 10 and may extend through the interior of device 10 to connect to circuitry on printed circuit 12. Solder may be used in coupling wires 26 to solder pads formed from the traces on printed circuit 12. Solder may also be used in mounting electrical components 14 to printed circuit 12.

Figure 4:
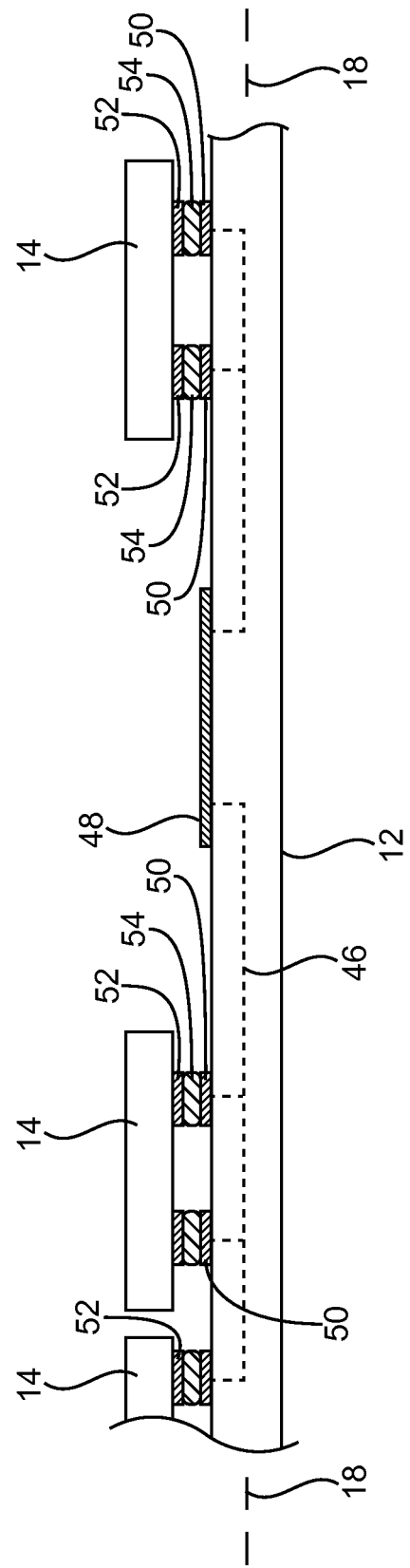
FIG. 4 is a cross-sectional side view of a portion of a printed circuit showing how electronic components may be mounted to the printed circuit in accordance with an embodiment.

A cross-sectional side view of an illustrative printed circuit onto which components have been mounted in shown in FIG. 4. As shown in FIG. 4, printed circuit board 12 may contain signal paths for routing traces between components 14. The signal paths may be formed from patterned metal traces on printed circuit 12 such as embedded signal lines 46, surface signal lines such as signal line 48, and contacts (solder pads) such as contacts 50. Components 14 may have contacts (solder pads 52). Solder 54 may be used to solder contacts 52 to contacts 50, thereby electrically connecting components 14 to the signal paths of printed circuit 12 and mechanically mounting components 14 to printed circuit 12.

Solder joints such as the printed circuit solder joints formed from solder 54 can connect components 14 to the signal paths of printed circuit 12, but can be subject to damage if there is excessive bending of printed circuit 12. When printed circuit 12 bends, stress is produced in the printed circuit and the spacing between solder joints changes. This can cause a solder joint to become loose. This effect is particularly noticeable in components 14 such as integrated circuits that have a sizable distance between respective contacts 52 (e.g., 1 mm or more or other suitable maximum pad-to-pad spacing along longitudinal axis 18). Certain signal lines on printed circuit 12 may also be damaged if printed circuit 12 bends excessively. On the other hand, some signal lines in printed circuit 12 may be robust (e.g., by using thinned metal and/or wider trace layouts).

Avoidance of all bending in printed circuit 12 is generally impractical, because it would involve making housing 16 and other structures overly complex and bulky. Nevertheless, care should be taken to avoid creating undesired levels of stress in printed circuit board 12, particularly in regions of printed circuit board 12 that contain sensitive circuitry. With one suitable arrangement, which is described herein as an example, a stress concentrator is attached to printed circuit board 12. The stress concentrator allows some bending and stress in printed circuit board 12 in areas that are free of sensitive circuitry such as components 14 to accommodate externally applied force, but maintains other areas of printed circuit board 12 in an unbent configuration to protect sensitive circuitry in those areas from bending-stress-induced damage.

Figure 5:
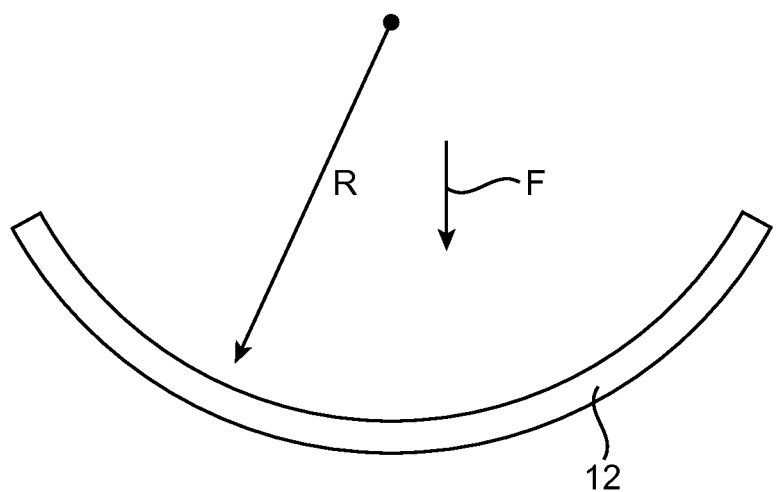
FIG. 5 is a cross-sectional side view of an illustrative printed circuit that has been bent sufficiently to exhibit a bend characterized by a radius of curvature.

As shown in FIG. 5, if printed circuit board 12 is not provided with a stress concentrator and is subjected to sufficient external lateral (downward) force F, printed circuit board 12 will bend in a relatively uniform manner. Board 12 may, for example, be characterized by a bend that exceeds a minimum bend radius R at all points along the length of board 12. The uniform bending behavior of printed circuit board 12 may cause sensitive areas of board 12 to be subjected to more bending and therefore more localized stress than is acceptable for the sensitive circuitry in those areas.

This challenge can be addressed by providing printed circuit board 12 with a stress concentrator that ensures that most or all bending of board 12 will occur only in one or more predefined locations along the length of board 12. The bend locations can be treated as "keep-out" regions that are maintained free of integrated circuits, dome switches, and other sensitive components 14 soldered to board 12. For example, board 12 can be populated with sensitive components 14 that are located in the unbendable portions of board 12 whereas stress-insensitive metal traces and other robust circuitry can be located in the bendable portions of board 12. By allowing board 12 to bend in the predefined bending locations, external forces on device 10 and board 12 can be accommodated without forming excessively bulky stiffening structures for the entire board length.

Figure 6:
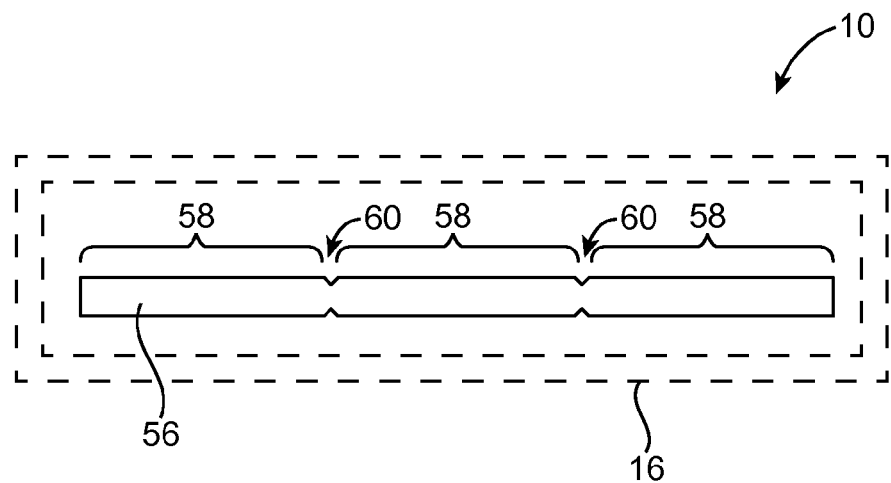
FIG. 6 is a cross-sectional side view of an illustrative printed circuit that has been provided with a stress concentrator in accordance with an embodiment.

FIG. 6 is a cross-sectional side view of an illustrative printed circuit board 12 that has been provided with a stress concentrator structure. The stress concentrator structure may be formed from metal, plastic, or other material and may be attached to one or more sides of printed circuit board 12. As an example, the stress concentrator may be formed from plastic that is injection molded over some or all of printed circuit board 12. Stress concentrator 56 and the printed circuit board in stress concentrator 56 may be mounted within housing 16 of device 10.

As shown in FIG. 6, stress concentrator structure 56 (e.g., an overmolded plastic member) may be provided with portions such as portion 58 that are relatively stiff and portions such as portions 60 that are thinner (i.e., that have narrower transverse dimensions) or that are otherwise locally weakened and are therefore more flexible than portions 58. Printed circuit board 12 may be embedded within stress concentrator 56 of FIG. 6 so that the longitudinal axis of printed circuit board 12 is aligned with the longitudinal axis of stress concentrator 56 and device 10.

Figure 7:
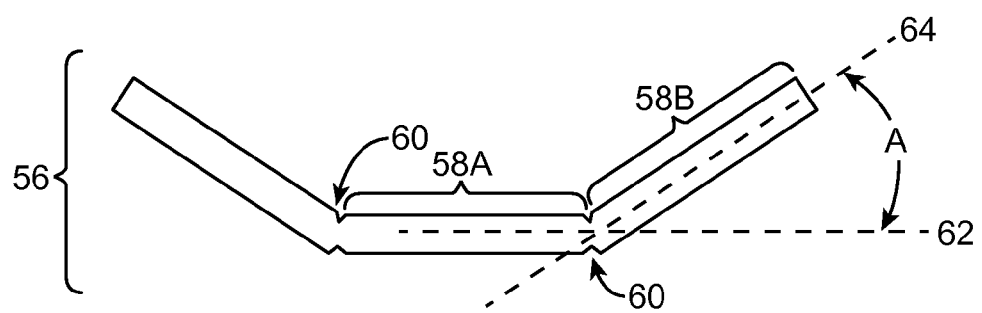
FIG. 7 is a cross-sectional side view of the illustrative printed circuit and stress concentrator of FIG. 6 following application of an external force that produces a bend in accordance with an embodiment.

Sensitive circuitry 14 may be mounted on printed circuit board 12 within less flexible unbent regions 58, whereas regions 60, which have enhanced flexibility, may be left free of sensitive circuitry. When subjected to external force, the structures of FIG. 7 will bend in enhanced flexibility regions 60, as shown in FIG. 7. The stiffness of stress concentrator 56 within regions 58 is preferably sufficient to maintain the portion of printed circuit board 12 that lies within regions 58 in a straight and relatively unbent configuration. The enhanced flexibility of stress concentrator 56 within enhanced flexibility regions 60 relative to regions 58 allows stress concentrator 56 and printed circuit board 12 within stress concentrator 56 to bend in regions 60, as shown in FIG. 7. Regions 60 do not contain any sensitive circuitry such as integrated circuits or other sensitive electrical components 14, so the bends formed in regions 60 will not cause any solder joint failures or other damage to printed circuit board 12 and the circuitry on board 12.

The amount of bending in regions 60 is greater than the amount of bending in straight unbent regions 58. For example, regions 58 may exhibit a relatively large bend radius (e.g., a bend radius of 50 cm or larger—effectively making regions 58 perfectly straight and unbent), whereas regions 60 may be characterized by a bend radius of less than 50 cm, less than 10 cm, or less than 2 cm (as examples). When bent as shown in FIG. 7, adjacent portions 58 such as portion 58A and 58B may be separated by a bend such as bend 66 having an angle A of 0.1-2°, 1-30°, 5-20°, 3-30°, less than 15° less than 7°, or other suitable angle. Straight portions 58 are essentially unbent (e.g., the largest angle between two portions of a segment of a straight region 58 is less than 1°, less than 0.2°, or has another suitable narrow angle value).

Figure 8:
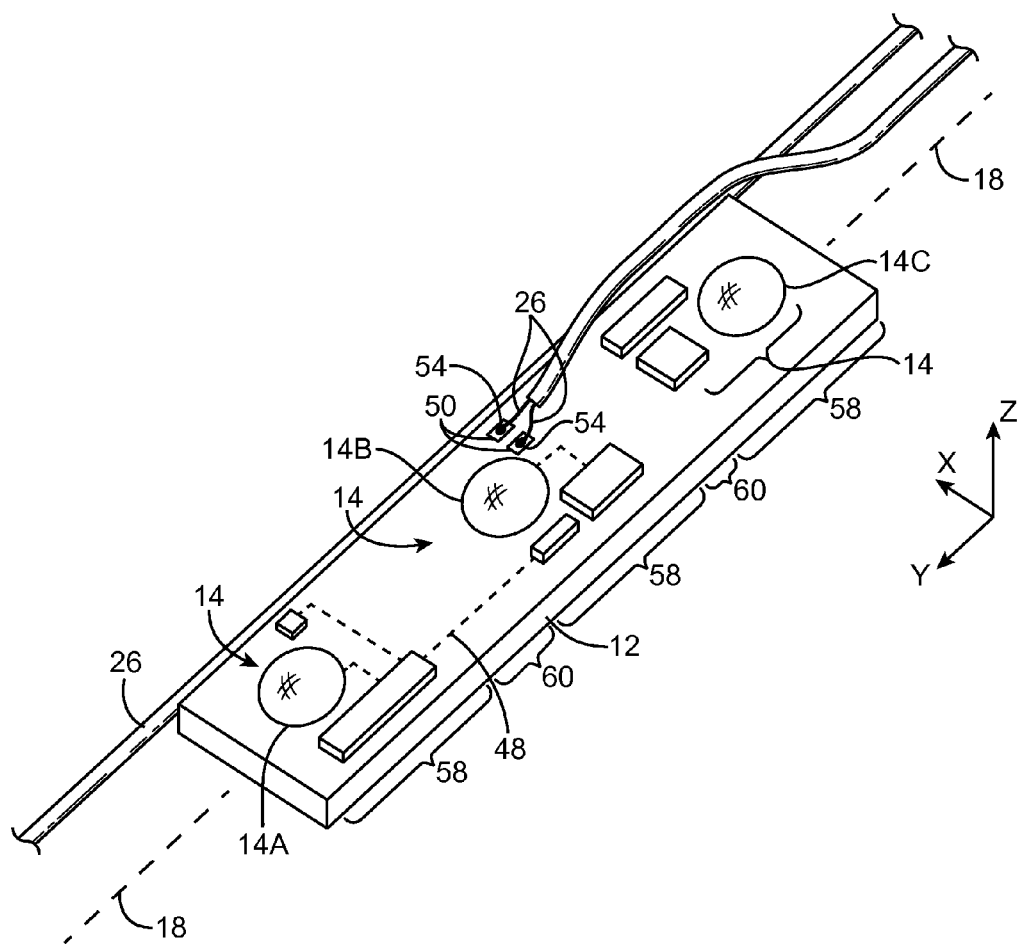
FIG. 8 is a perspective view of an illustrative printed circuit that has been populated with electronic components such as switches, integrated circuits, and other potentially sensitive circuitry in accordance with an embodiment.

FIG. 8 is a perspective view of an illustrative printed circuit that has been populated with electronic components such as buttons, integrated circuits, wires, and other potentially sensitive circuitry 14. As shown in FIG. 8, wires such as wires 26 may be soldered to contacts 50 on printed circuit board 12 using solder 54. Stress-sensitive electronic components such as switches 14A, 14B, and 14C and other sensitive circuitry 14 may be soldered or otherwise mounted to traces such contacts 50 on printed circuit board 12. Circuitry that is not sensitive to stress from bending such as illustrative trace 48 of FIG. 8 may be located in enhanced flexibility regions 60 (i.e., regions where a subsequently formed stress concentrator will allow bending). Sensitive circuitry 14 may be located in unbent regions 58 (i.e., regions where the stress concentrator will not allow bending).

Figure 9:
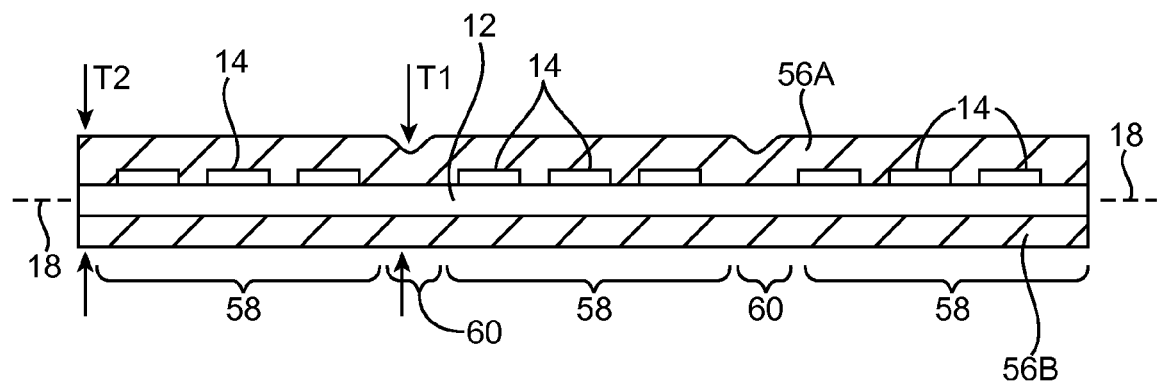
FIG. 9 is a cross-sectional side view of an illustrative printed circuit that has been covered with overmolded plastic that forms a stress concentrator to concentrate stress from bending the printed circuit into particular locations along the length of the printed circuit that are devoid of sensitive circuitry in accordance with an embodiment.

Stress concentrator 56 may be formed by overmolding plastic over printed circuit board 12. Flexibility enhancement features such locally thinned portions of the overmolded plastic material may be formed in regions 60. An illustrative configuration for stress concentrator 56 is shown in FIG. 9. As shown in FIG. 9, stress concentrator 56 may be formed by overmolding plastic onto printed circuit board 12, so that some plastic is formed above and below printed circuit board 12. In this type of configuration, printed circuit board 12 will be embedded within the plastic of stress concentrator 56. For example, stress concentrator 56 may have an upper portion such as portion 56A that overlaps circuitry 14 on the upper surface of printed circuit board 12 and may have a lower portion on the opposing lower surface of printed circuit board 12 such as illustrative lower portion 56B. Portions 56A and 56B may form parts of an integral molded plastic piece or may be separate layers of plastic. Electronic components 14 may be mounted on the upper surface of printed circuit board 12 as shown in FIG. 9 and/or may be mounted on the opposing lower surface of printed circuit board 12.

The thickness and other stiffness attributes of stress concentrator 56 may be locally adjusted to promote bending in regions 60 over regions 58. As shown in FIG. 9, stress concentrator 56 may have a transverse dimension (i.e., a dimension perpendicular to longitudinal axis 18) such as thickness T2. Thickness T2 is sufficient to maintain printed circuit board 12 and sensitive circuitry 14 in unbent regions 58 in a straight (unbent) configuration. In enhanced flexibility regions 60, the transverse dimensions of stress concentrator 56 relative to longitudinal axis 18 may be decreased (narrowed) relative to the transverse dimensions of stress concentrator 56 in straight regions 58. For example, the thickness of stress concentrator 56 in regions 60 may be decreased to a minimum of T1, where T1 is less than minimum thickness value T2 in regions 58. Because less stress concentrator material is present in regions 60 than regions 58, regions 60 will be more flexible than regions 58. This concentrates flexing (and printed circuit board stress) into regions 60, thereby ensuring that sensitive circuitry 14 on printed circuit board 12 in regions 58 will not bend and will not be exposed to excessive stress.

Figure 10:
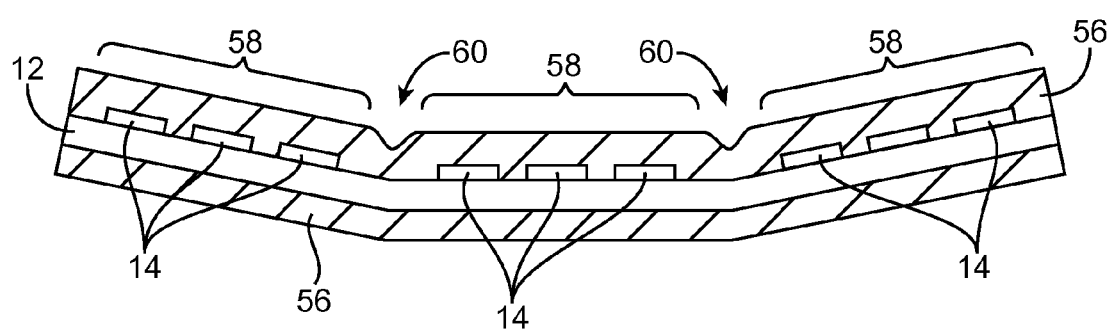
FIG. 10 is a cross-sectional side view of the printed circuit and stress concentrator of FIG. 9 during the application of external stress that bends the printed circuit in accordance with an embodiment.

FIG. 10 is a cross-sectional side view of illustrative stress concentrator 56 of FIG. 9 following bending. As shown in FIG. 10, stiff unbent regions 58 remain straight, whereas enhanced flexibility regions 60 allow stress concentrator 56 and embedded printed circuit board 12 to bend more than in regions 58 when external force is applied to device 10 (e.g., body 16 and/or other portions of device 10) and thereby to stress concentrator 56 in device 10.

Figure 11:
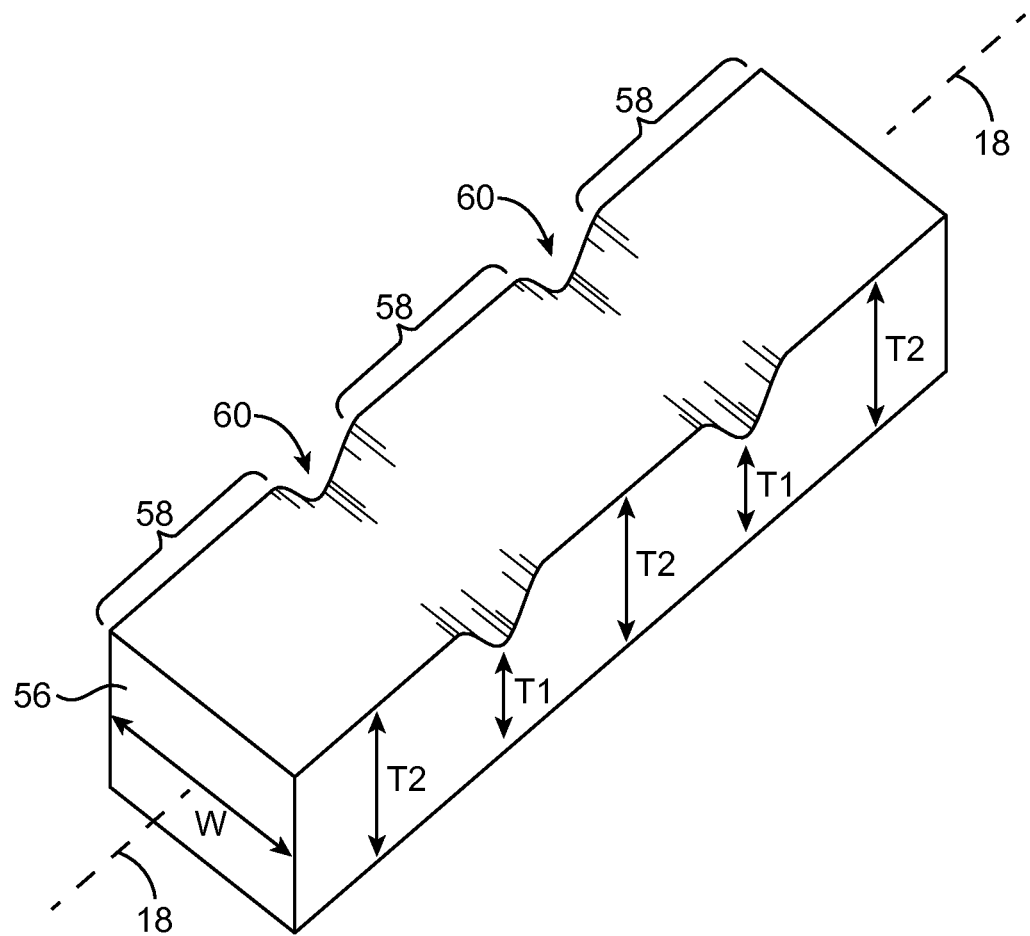
FIG. 11 is a perspective view of an illustrative stress concentrator formed from overmolded plastic with one-sided vertical indentations in accordance with an embodiment.

Enhanced flexibility regions 60 in stress concentrator 56 may be provided by local vertical thinning of the top surface of stress concentrator 56, as shown in the illustrative single-sided thinning arrangement of FIG. 11. Due to the presence of vertical notches on the top surface of stress concentrator 56, thickness T1 of stress concentrator 56 in enhanced flexibility regions 60 is less than thickness T2 of stress concentrator 56 in regions 58 while width W is the same for both regions 58 and 60.

Figure 12:
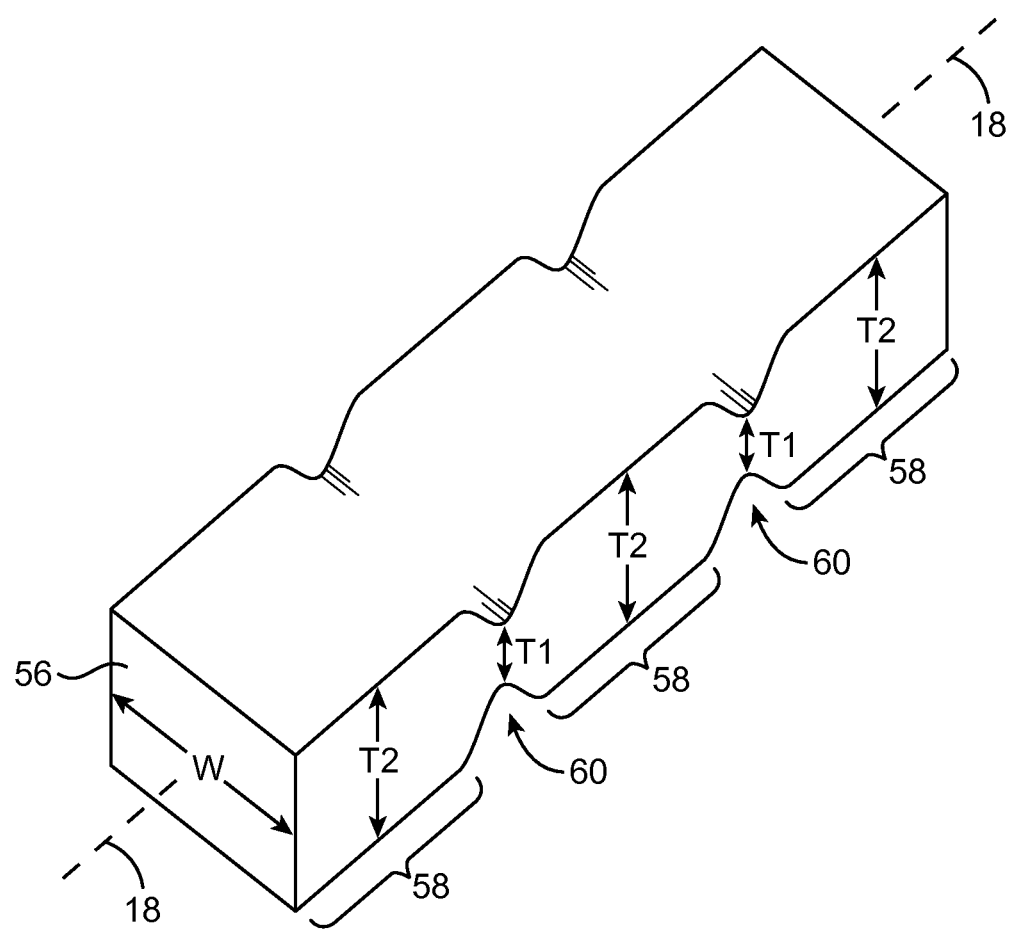
FIG. 12 is a perspective view of an illustrative stress concentrator formed from overmolded plastic with two-sided vertical indentations on opposing sides of an embedded printed circuit in accordance with an embodiment.

FIG. 12 shows how enhanced flexibility regions 60 may be formed by thinning stress concentrator 56 using notches on opposing upper and lower surfaces of stress concentrator 56 while leaving width W the same for both regions 58 and 60. As shown in FIG. 12, by providing aligned notches on the upper and lower surfaces, reduced thickness T1 (i.e., a reduced vertical transverse dimension perpendicular to longitudinal axis 18) is created in regions 60 relative to thickness T2 in regions 58. This enhances the flexibility of stress concentrator 58 in regions 60.

Figure 13:
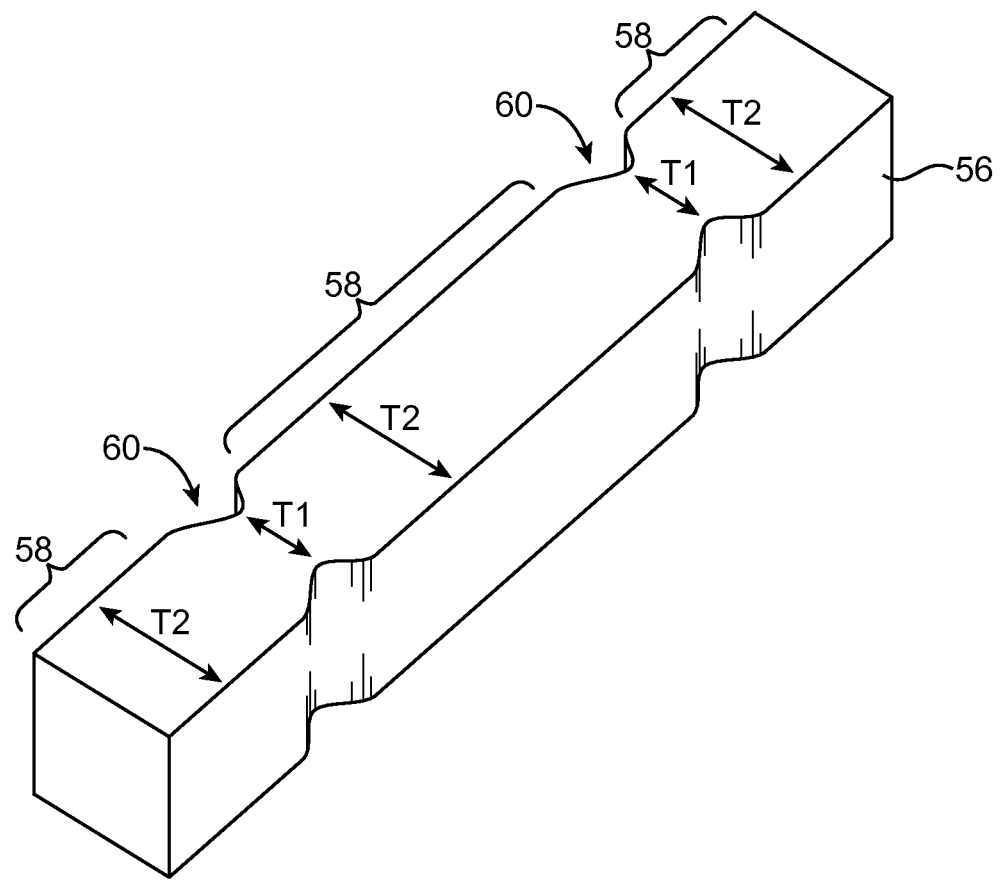
FIG. 13 is a perspective view of an illustrative stress concentrator formed from horizontal indentations at two different locations along the length of an embedded printed circuit in accordance with an embodiment.

If desired, horizontal narrowing of stress concentrator 56 may be used to create locally reduced transverse dimensions (see, e.g., reduced horizontal transverse dimension T1 of FIG. 13 from horizontally extending notches). Because transverse dimension T1 of stress concentrator 56 in regions 60 is less than transverse dimension T2 in regions 58, stress concentrator 56 of FIG. 13 (and therefore the printed circuit board embedded within stress concentrator 56) may flex more in regions 60 than in regions 58, thereby preventing damage to sensitive circuitry 14 in regions 58.

Figure 14:
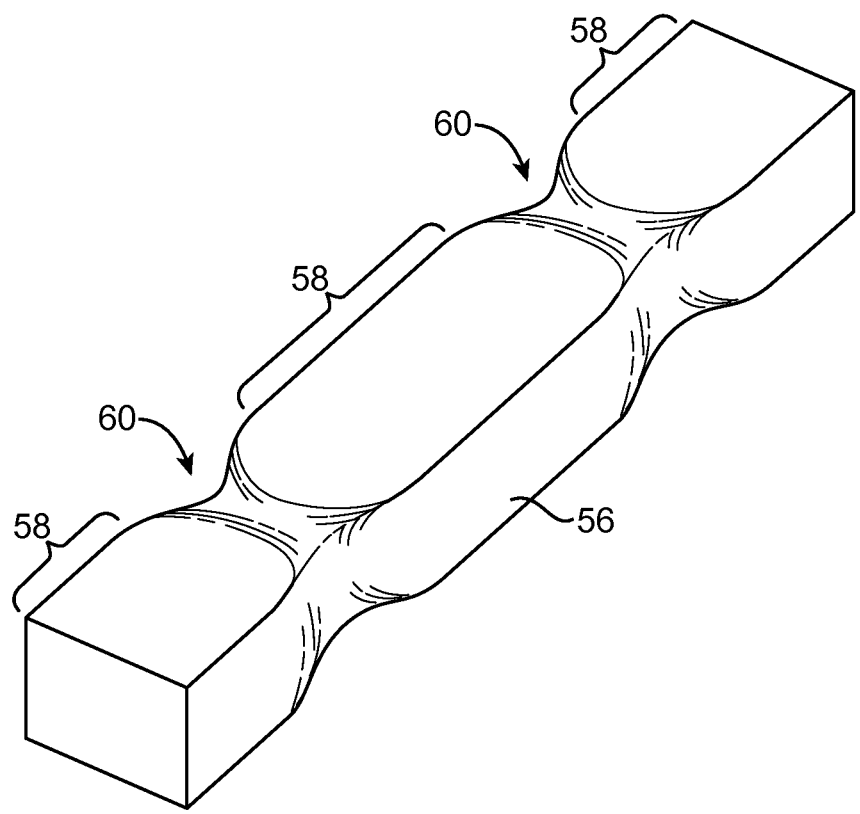
FIG. 14 is a perspective view of an illustrative stress concentrator formed from ring-shaped indentations that run around the body of an overmolded stress concentrator at two different locations along the length of an embedded printed circuit in accordance with an embodiment.

FIG. 14 is a perspective view of an illustrative stress concentrator in which material has been removed from the stress concentrator to narrow the stress concentrator in both vertical and horizontal transverse dimensions. As shown in FIG. 14, stress concentrator 56 has a narrowed ring-shaped region in each enhanced flexibility region 60.

Figure 15:
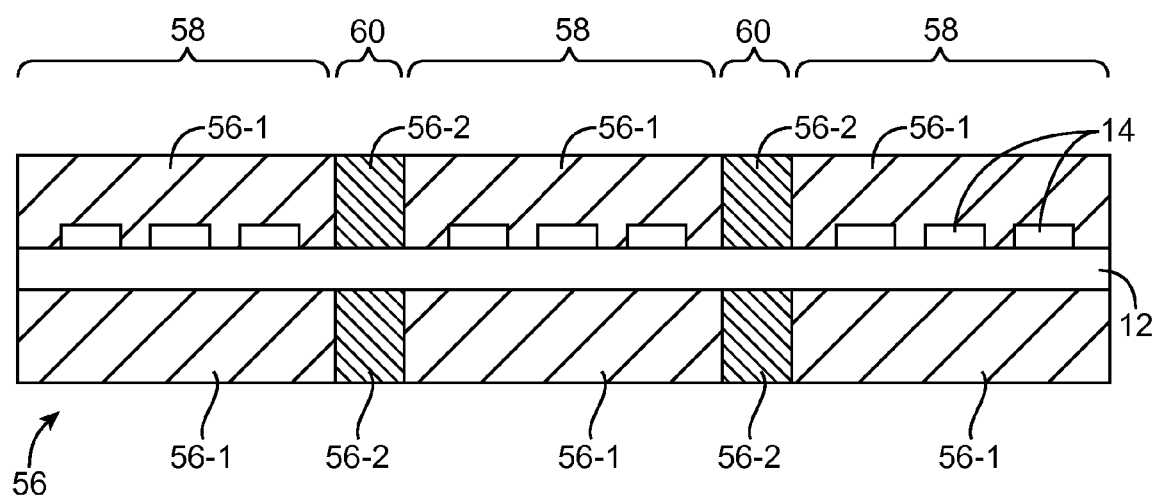
FIG. 15 is a cross-sectional side view of an illustrative stress concentrator formed from multiple overmolded shots of plastic with different flexibilities or other materials with different flexibilities in accordance with an embodiment.

If desired, enhanced flexibility regions 60 of stress concentrator 56 can be formed by incorporating material into regions 60 that is more flexible than the material in regions 58. For example, stress concentrator 56 may be provided with a first material in regions 58 and a second material in regions 60. The material in regions 60 may be more flexible than the material in regions 58, thereby enhancing the flexibility of stress concentrator 56 in regions 60 relative to regions 58. FIG. 15 is a cross-sectional side view of stress concentrator 56 in this type of configuration. As shown in FIG. 15, regions 58 may contain overmolded plastic 56-1 and regions 60 may contain overmolded plastic 56-2. Plastic 56-1 and plastic 56-2 may be formed from different types of plastic, from plastic containing different types of filler structures, from plastic treated in different ways to change its flexibility, etc. Printed circuit board 12 and sensitive electrical components 14 may be embedded within stress concentrator 56. Sensitive circuitry 14 may be restricted to unbent regions 58, to avoid damage from flexing of printed circuit board 12 in enhanced flexibility regions 60.

Figure 16:
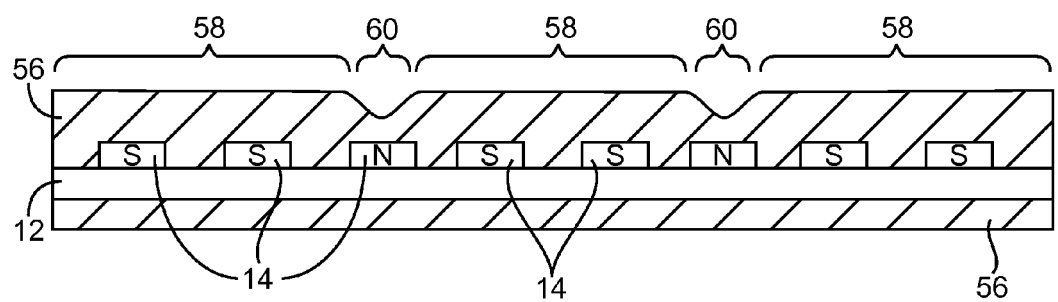
FIG. 16 is a cross-sectional side view of an illustrative printed circuit onto which electronic components that are sensitive to bending damage and that are insensitive to bending damage have been mounted showing how an overmolded stress concentrator may concentrate stress on the insensitive components in accordance with an embodiment.

FIG. 16 is a cross-sectional side view of stress concentrator 56 and embedded printed circuit board 12 in an illustrative configuration in which circuitry 14 includes both sensitive circuitry S and insensitive circuitry N. Sensitive circuitry S includes integrated circuits and other components (e.g., components with solder joints that are separated by a pad-to-pad spacing that makes the components sensitive to stress-induced damage) and other circuitry that is prone to stress-induced failure in the event that printed circuit board 12 bends as shown in FIG. 5 during use of device 10 by a user. Insensitive circuitry N is less sensitive to stress and can reliably withstand the bending conditions that cause sensitive circuitry S to be damaged. As shown in FIG. 16, the reduced sensitivity of the components of circuitry N relative to the components of circuitry S allows insensitive circuitry N to be mounted in enhanced flexibility regions 60, while sensitive components in circuitry S are restricted to regions 58. Examples of circuit components that are less sensitive to stress-induced failure and that therefore might be safely mounted in regions 60 in some usage scenarios include small discrete components (e.g., capacitors, inductors, resistors, etc.) and/or components that are mounted with contacts arranged along a transverse dimension perpendicular to longitudinal axis 18. Components such as these do not tend to have widely spaced solder joints and therefore experience less solder joint displacement for a given amount of bend in printed circuit board 14 than larger components such as integrated circuits, switches, and other circuits (e.g., elongated components mounted parallel to longitudinal axis 18 of device 10) that have relatively large distances between solder joints.

Figure 17:
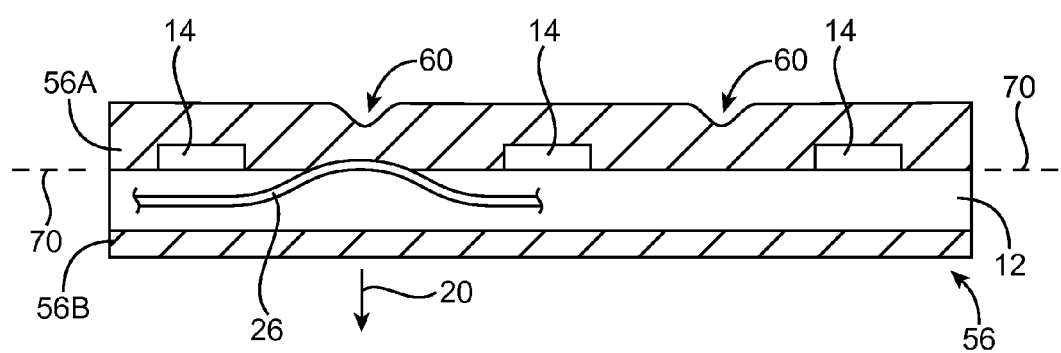
FIG. 17 is a cross-sectional side view of an illustrative printed circuit assembly for an electronic device in which an overmolded stress concentrator has been configured to create a neutral stress plane that is aligned with electrical components mounted on a printed circuit in accordance with an embodiment.

If desired, the amount of stress concentrator material 56A that is formed above the upper surface of printed circuit 14 and the amount of stress concentrator material 56B that is formed below the lower surface of printed circuit 14 can be balanced to locate the neutral stress plane of stress concentrator 56 in alignment with components 14 on printed circuit board 12. As shown in FIG. 17, for example, stress concentrator portion 56A may have a different (e.g., larger) thickness than stress concentrator portion 56B. When stress concentrator 56 (e.g., the portion of stress concentrator 56 associated with the left-hand enhanced flexibility region 60 in the FIG. 17 example) moves downward in direction 20 relative to the remaining portions of stress concentrator 56, upper portion 56A of stress concentrator 56 at the bend will be under compressive stress, whereas lower portion 56B and printed circuit board 12 will be under tensile stress.

Neutral stress plane 70 represents the plane along which stress is minimized during bending. Within neutral stress plane 70, compressive stress on one side of the plane is balanced by the tensile stress on the other side of the plane. By configuring the thicknesses of layers 56A and 56B appropriately, neutral stress plane 70 can be aligned with the solder joints, surface traces, and other sensitive structures within circuitry 14 on printed circuit board 12. By aligning neutral stress plane 70 with circuitry 14 in this way, stress-induced failures may be minimized due to flexing of stress concentrator 56 and printed circuit board 12 in enhanced flexibility regions 60. If desired, wires such as wires 26 can be routed to pass though neutral stress plane 70 (either along the entire length of device 10 or locally in regions prone to bending such as enhanced flexibility regions 60, as shown in FIG. 17).

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a printed circuit board;
   circuitry mounted on a surface of the printed circuit board, wherein the circuitry includes a dome switch that is soldered to the printed circuit board; and
   a stress concentrator with an enhanced flexibility region, wherein the stress concentrator restricts bending of the printed circuit board to the enhanced flexibility region, wherein the stress concentrator comprises plastic overmolded over the printed circuit board such that the plastic is in direct contact with the surface and the circuitry, wherein the dome switch is covered by the plastic, wherein the printed circuit board is elongated along a longitudinal axis, wherein the printed circuit board has a uniform height along the length of the longitudinal axis, and wherein the printed circuit board has a uniform rigidity along the length of the longitudinal axis.

2. The apparatus defined in claim 1 wherein the stress concentrator is elongated along the longitudinal axis.

3. The apparatus defined in claim 2 wherein the stress concentrator has transverse dimensions that are perpendicular to the longitudinal axis and wherein the stress concentrator has at least one locally narrowed transverse dimension in the enhanced flexibility region.

4. The apparatus defined in claim 3 wherein the stress concentrator comprises unbent regions and wherein the enhanced flexibility region is more flexible than the unbent regions.

5. The apparatus defined in claim 4 wherein the stress concentrator comprises an additional enhanced flexibility region at a different location along the longitudinal axis from the enhanced flexibility region.

6. The apparatus defined in claim 4 wherein the circuitry comprises electrical components in the unbent regions, wherein the enhanced flexibility region is free of any electrical components.

7. The apparatus defined in claim 4 wherein the circuitry comprises integrated circuits in the unbent regions and does not have integrated circuits in the enhanced flexibility region.

8. The apparatus defined in claim 2 wherein the stress concentrator has a first material and a second material, wherein the second material is located in the enhanced flexibility region, wherein the first material comprises a first plastic, and wherein the second material comprises a second plastic that is more flexible than the first plastic.

9. The apparatus defined in claim 2 further comprising a plastic body that surrounds the stress concentrator.

10. The apparatus defined in claim 9 wherein the plastic body comprises flexible plastic that deforms when a user presses the plastic body to use the dome switches.

11. The apparatus defined in claim 10 wherein the stress concentrator comprises unbent regions, wherein the enhanced flexibility region is more flexible than the unbent regions, and wherein the enhanced flexibility region is located between the unbent regions.

12. The apparatus defined in claim 1, wherein the printed circuit board is embedded in the plastic such that the plastic completely surrounds the printed circuit board and the dome switch.

13. The apparatus defined in claim 1, wherein the enhanced flexibility region has a narrowed ring-shape region.

14. The apparatus defined in claim 1, wherein the dome switch is completely covered by and in direct contact with the plastic.

15. The apparatus defined in claim 1, wherein the printed circuit board is a rigid printed circuit board.

16. Apparatus, comprising:
a printed circuit board;
electronic components soldered to the printed circuit board; and
a stress concentrator with unbent regions separated by an enhanced flexibility region that is more flexible than the unbent regions, wherein the stress concentrator prevents bending of the printed circuit board in the unbent regions and allows bending of the printed circuit board in the enhanced flexibility region, wherein the unbent regions are formed from only a first material, wherein the enhanced flexibility region is formed from only a second material, wherein the second material is more flexible than the first material, wherein the first material has a first thickness, and wherein the second material has a second thickness that is the same as the first thickness.

17. The apparatus defined in claim 16 wherein the electronic components include a component selected from the group consisting of: an integrated circuit, a sensor, and a switch and wherein the electronic components have contacts that are soldered to solder pads on the printed circuit board.

18. The apparatus defined in claim 16, wherein at least one of the electronic components is soldered to the printed circuit board in the enhanced flexibility region.

19. A headset controller, comprising:
a printed circuit board;
a molded plastic stress concentrator on the printed circuit board; and
a housing in which the printed circuit board and molded plastic stress concentrator are mounted, wherein the molded plastic stress concentrator is elongated along a longitudinal axis, wherein the molded plastic stress concentrator has planar regions characterized by first and second transverse dimensions that are perpendicular to the longitudinal axis and has enhanced flexibility regions characterized by third and fourth transverse dimensions that are narrowed with respect to the first and second transverse dimensions of the planar regions, and wherein the enhanced flexibility regions enable the planar regions to be bent in a first direction and a second direction that is perpendicular to the first direction.

20. The headset controller defined in claim 19 further comprising electronic components mounted on the printed circuit board in the planar regions.

21. The headset controller defined in claim 20 wherein the printed circuit board is free of stress-sensitive electronic components in the enhanced flexibility region, wherein the electronic components include switches, and wherein the housing is flexible to allow a user to depress the switches.

22. The headset controller defined in claim 19, wherein the first and second transverse dimensions are perpendicular, wherein the third transverse dimension is parallel to the first transverse dimension, and wherein the fourth transverse dimension is parallel to the second transverse dimension.

* * * * *